(12) United States Patent
Miguelez et al.

(10) Patent No.: US 6,865,199 B2
(45) Date of Patent: Mar. 8, 2005

(54) INEXPENSIVE ANALOG LASER MODULE

(75) Inventors: Philip Miguelez, Warminster, PA (US);
Shutong Zhou, Lansdale, PA (US);
Richard A. Meier, Abington, PA (US);
N. John Nagurny, Manassas, VA (US)

(73) Assignee: General Instrument Corporation,
Horsham, PA (US)

( * ) Notice: Subject to any disclaimer, the term of this patent is extended or adjusted under 35 U.S.C. 154(b) by 0 days.

(21) Appl. No.: 10/207,740

(22) Filed: Jul. 29, 2002

(65) Prior Publication Data

US 2003/0072337 A1 Apr. 17, 2003

Related U.S. Application Data

(60) Provisional application No. 60/308,315, filed on Jul. 27, 2001.

(51) Int. Cl.[7] ................................................. H01S 3/04
(52) U.S. Cl. ......................................... 372/34; 372/36
(58) Field of Search ..................................... 372/34, 36

(56) References Cited

U.S. PATENT DOCUMENTS

| | | | |
|---|---|---|---|
| 5,060,114 A | 10/1991 | Feinberg et al. | 361/387 |
| 5,353,294 A | 10/1994 | Shigeno | 372/43 |
| 5,399,858 A | 3/1995 | Kinoshita | 250/239 |
| 5,572,541 A | 11/1996 | Suni | 372/70 |
| 5,731,602 A | 3/1998 | Pan et al. | 257/98 |
| 5,892,615 A | 4/1999 | Grubb et al. | 359/341 |
| 6,072,815 A | 6/2000 | Peterson | 372/36 |
| 6,107,877 A | 8/2000 | Miguelez et al. | 330/66 |
| 6,198,757 B1 * | 3/2001 | Broutin et al. | 372/34 |
| 6,227,724 B1 | 5/2001 | Verdiell | 385/91 |
| 6,232,836 B1 | 5/2001 | Zhou | 330/149 |
| 6,247,852 B1 | 6/2001 | Joyce | 385/90 |
| 6,272,157 B1 * | 8/2001 | Broutin et al. | 372/32 |

* cited by examiner

*Primary Examiner*—Minsun Oh Harvey
*Assistant Examiner*—James Menefee
(74) *Attorney, Agent, or Firm*—Mayer Fortkort & Williams, PC; Stuart H. Mayer, Esq.; Karin L. Williams, Esq.

(57) ABSTRACT

A method is provided for using an uncooled laser package having pre-established performance specifications that include a pre-established optical power level. The package is to be used at a second set of performance specifications that include a second optical power level greater than the pre-established optical power level. The method begins by applying a bias level to a laser diode in the uncooled laser package that optimizes distortion and causes the laser package to generate the second optical power level. The bias level is greater than a pre-established bias level specified to generate the pre-established optical power level. Next, the uncooled laser package is heated or cooled to maintain a substantially constant laser diode temperature.

20 Claims, 3 Drawing Sheets

INEXPENSIVE ANALOG LASER MODULE

STATEMENT OF RELATED APPLICATION

This application claims the benefit of priority to U.S. Provisional Patent application Ser. No. 60/308,315, filed Jul. 27, 2001 and entitled "Low Cost Analog Laser Module."

FIELD OF THE INVENTION

The present invention relates generally to laser diodes and more particularly to a relatively inexpensive, uncooled laser diode package that can be used in CATV applications at optical output powers that are higher than the laser manufacturer's specifications.

BACKGROUND OF THE INVENTION

Laser diode manufacturers typically offer a line of laser diodes that are designed to operate at different output powers. Sometimes these different laser diodes are structurally the same, but are simply operated at different bias levels to achieve the different output powers. Generally, the manufacturers package laser diodes in different ways that depend on the applications for which they are to be used. For example, a high power (e.g., 10 mw) laser diode designed for analog applications such as CATV systems, which must meet relatively stringent specifications for linearity, are often housed in a standard in-line hermetic package such as a butterfly package that includes internal cooling to maintain the temperature of the laser diode. In CATV applications, such high power lasers are often used in the forward transmission path from the headend to the network node that is in communication with the cable subscriber. Other lower power (e.g., 2 mw) laser diodes, which do not need to meet such stringent specifications for linearity, are often housed in a low cost TO-style coaxial can that does not provide internal cooling.

FIG. 1 shows an example of a coaxial can laser package that is incorporated into a laser module that includes a lens, an optical fiber for receiving the light from the laser package. In particular, coaxial can laser package 120 includes a laser diode chip 101 that is fixed to a stem 103 via a heat sink 102. A cap 104 hermetically seals the package 120. The cap 104 has a window 109 through which light from the laser diode chip 101 is emitted. The can laser package 120 is depicted in operative association with a lens holder 106. Lens holder 106 includes a lens 105 and an optical fiber 107. An optical isolator 110 is incorporated into the pigtail of the laser package 120 to maintain optimum distortion and noise performance. As previously noted, the coaxial can laser package 120 does not include a cooling element nor a mechanism for monitoring the temperature of the laser diode chip 101.

As might be expected, lower power, uncooled laser packages such as the aforementioned coaxial can laser package are typically substantially less expensive than an internally cooled butterfly laser package. Accordingly, it would be desirable to employ a coaxial can laser so that it can operate at higher optical powers while meeting the more stringent specifications for linearity that are often required of such lasers, while also provisioning the can laser package with a cooling and temperature monitoring arrangement, all at a cost that is less than a commercially available high power butterfly laser package.

SUMMARY OF THE INVENTION

The present invention provides a method for using an uncooled laser package having pre-established performance specifications that include a pre-established optical power level. The package is to be used at a second set of performance specifications that include a second optical power level greater than the pre-established optical power level. The method begins by applying a bias level to a laser diode in the uncooled laser package that optimizes distortion and causes the laser package to generate the second optical power level. The bias level is greater than a pre-established bias level specified to generate the pre-established optical power level. Next, the uncooled laser package is heated or cooled to maintain a substantially constant laser diode temperature.

In accordance with one aspect of the invention, the external heating or cooling step includes the step of monitoring the temperature of the laser diode. The temperature monitoring step may be performed by monitoring a photocurrent generated by a photodiode that collects light from a back-facet of the laser diode. The temperature monitoring step may include the step of maintaining the photocurrent generated by the photodiode at a substantially constant value.

In accordance with another aspect of the invention, the step of maintaining the photocurrent generated by the photodiode at a substantially constant value includes the step of adjusting the degree of heating or cooling supplied to the laser package in response to a measured value of the photocurrent.

In accordance with yet another aspect of the invention, the uncooled laser package is a coaxial can laser package.

In accordance with another aspect of the invention, any remaining distortion that has not previously been reduced is reduced by a predistortion circuit such as an in-line predistortion circuit.

In accordance with another aspect of the invention, a thermally-regulated laser module includes an uncooled, hermetically sealed laser package in which a laser diode is located. A thermo-electric cooler is thermally coupled to the laser package.

In accordance with another aspect of the invention, the laser package is a coaxial can laser.

In accordance with another aspect of the invention, the thermo-electric cooler is a peltier cooler.

In accordance with another aspect of the invention, a heat sink is provided in which the coaxial can laser is housed.

In accordance with yet another aspect of the invention, a thermally conducting clamp mechanically secures the coaxial can laser package to the thermo-electric cooler.

In accordance with another aspect of the invention, an insulating foam substantially filling the heat sink. Alternatively, a premolded insulating covering may be located over the laser package and the thermally conducting clamp.

In accordance with another aspect of the invention, a temperature monitor is provided for determining the temperature of the laser diode.

In accordance with another aspect of the invention, the laser diode includes a photodiode that monitors a photocurrent by collecting light from a back-facet of the laser diode to determine a laser output power from which the temperature monitor determines the laser diode temperature.

In accordance with another aspect of the invention, a feedback controller is provided for maintaining the photocurrent generated by the photodiode at a substantially constant value.

In accordance with another aspect of the invention, the feedback controller is electrically coupled to the thermoelectric cooler for adjusting a degree of heating or cooling supplied to the coaxial can laser by the thermo-electric cooler in response to a measured value of the photocurrent.

DETAILED DESCRIPTION

Figure 1:
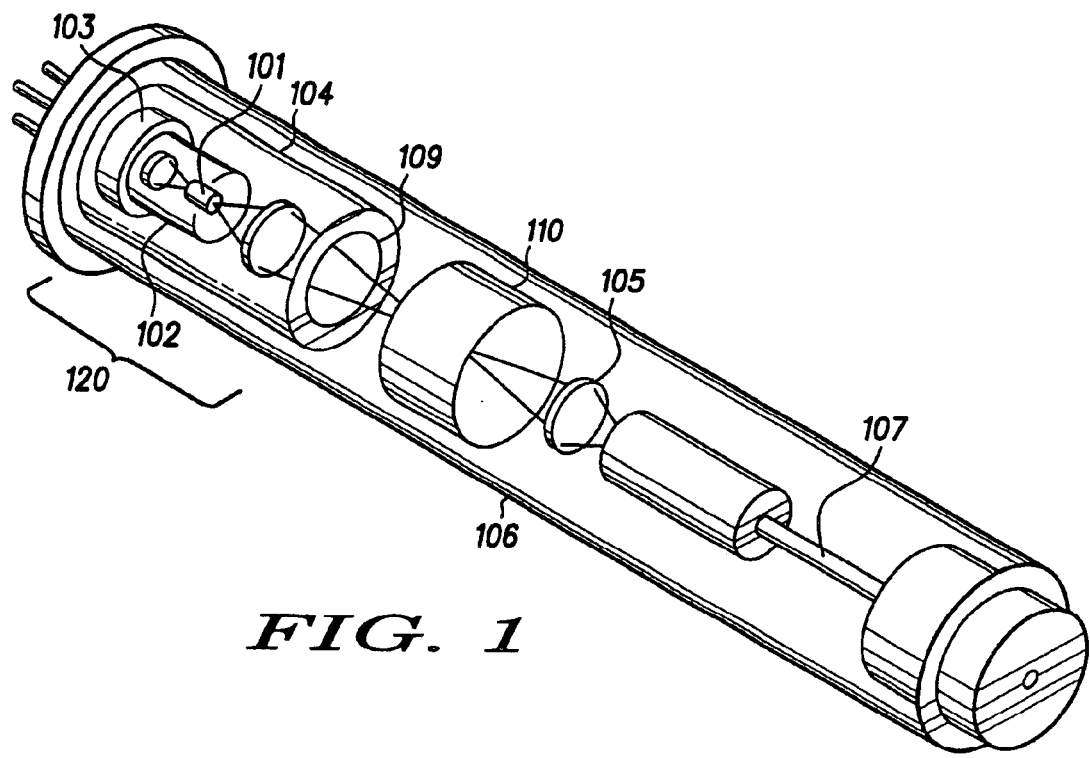
FIG. 1 shows an example of a conventional coaxial can laser package.

The present inventors have surprisingly determined that the bias of certain commercially available low power laser diode can be increased beyond that established in the manufacturer's specifications so that the diode operates at higher powers while maintaining distortions at an acceptable level. This technique generally can be applied to some laser diodes that are structurally the same, but which are specified by the manufacturer to be operated at different bias levels to achieve their different output powers. One important advantage of this technique is that a substantial cost savings can be achieved since lower power, un-cooled laser diode packages are typically much less expensive than higher power laser diode packages.

In accordance with the present invention, the bias of a lower power laser diode is varied until a "sweet-spot" is located, which is an increased bias level at which the modulation distortion is optimized. This bias level (and hence the resulting output power) will generally vary from diode to diode and can be experimentally determined for each given laser diode. Modulation distortions in the optical signal generated by the laser arise from the laser's non-linearity. For example, the performance of a distributed feedback (DFB) laser is primarily limited by second-order distortion, which adversely affects the optical modulation depth (OMD) of the signal.

Various attempts have been made to address this distortion problem. In basic principle, a popular solution calls for a predistortion circuit, which is used to distort the signal before it is processed by the non-linear processing element. This predistortion is matched to the distortion that will be caused during processing by the non-linear processing element so as to cancel out that distortion. Accordingly, in the present invention, once the so-called "sweet-spot" of the laser diode has been located at which distortion is optimized, the distortion may be reduced by a pre-distortion circuit. By correcting for distortion in this manner the inventors have found that in some cases a relatively inexpensive laser diode specified for low power uses can be used as a higher power laser that meets more stringent specifications.

Predistortion circuits that may be employed in the present invention include circuits based on multipath distortion techniques and inline predistortion techniques. In the multipath distortion technique, the input source signal is split between two or more separate distortion producing paths connected in parallel. One disadvantage of this technique is that it requires complex system components and adjustment, thus increasing the cost and reducing the system reliability. In the inline predistortion technique, the input RF signal is passed in series through a distortion-producing path. In this technique, a distortion signal is estimated and generated that is equal in amplitude but opposite in phase to the distortion component generated by the laser diode. The distortion signal is used to cancel the distortion produced by the laser diode, thereby improving its operating characteristics. This method is the simplest technique for laser distortion correction.

Figure 2A:
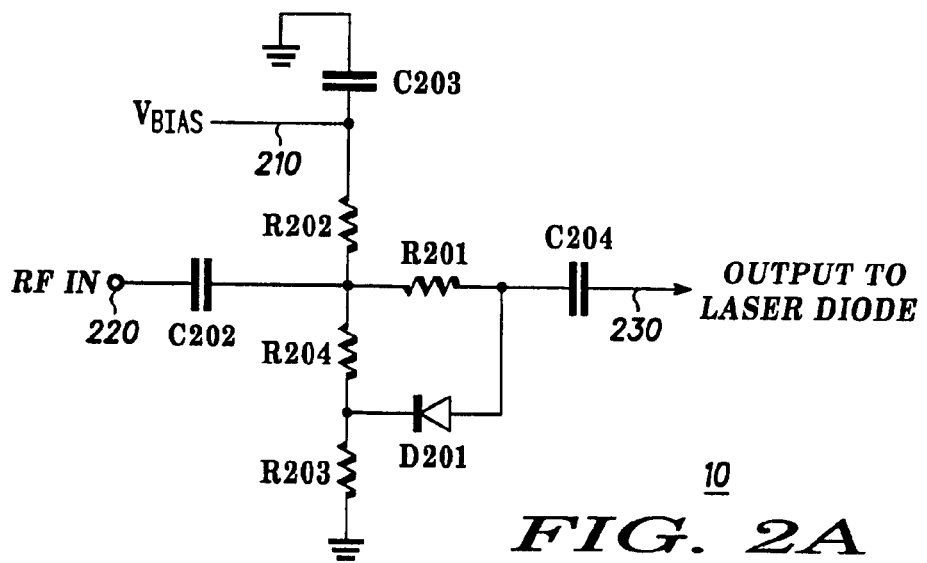
FIGS. 2A and 2B show an example of an inline second order predistortion circuit that may be employed in the present invention.

One example of an inline pre-distortion circuit that may be employed in the present invention is disclosed in copending U.S. application Ser. No. 10/191,557, which is hereby incorporated by reference in its entirety. As shown in FIG. 2(a), this circuit includes an RF input 220, a DC bias voltage input 210, a diode D201 for providing nonlinear current, and an RF attenuator that is preferably designed to match the 75-ohm characteristic impedance used by a CATV system. The RF attenuator includes capacitors C202, C203, C204, and resistors R201, R202, R203, and R204. A typical RF signal level at input 220 to the circuit is 35 dBmv/channel with 110 channels. Capacitors C202, C203, and C204 are used to provide DC blocking. Resistors R202, R203, and R204, in combination with DC bias 220, provide control of the forward bias to diode D201. The nonlinear distortion correction is produced by diode D201, which is directly connected in parallel with resistors R201 and R204.

In operation, the RF current flowing through resistor R201 causes RF voltage to appear across the diode D201. When the forward voltage across the diode D201 increases, more RF current will flow through the diode D201, causing the momentary decrease in the insertion loss of the RF attenuator circuit. The current flowing through the diode D201 generates composite second order (CSO) distortion, which is used for inline distortion correction.

Figure 2B:
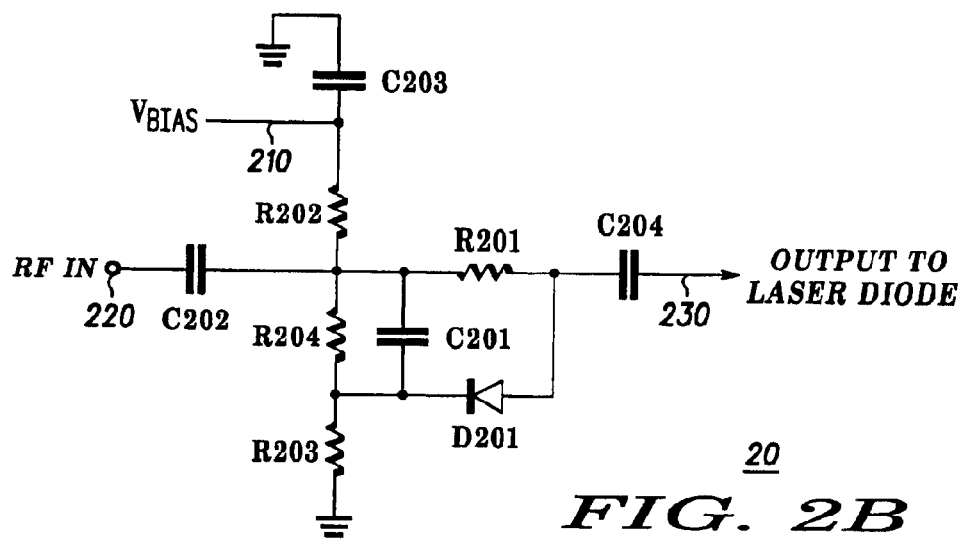

Another example of a predistortion circuit that may be employed in the present invention is shown in FIG. 2(b). In this circuit a capacitor C201 is connected in parallel to resistor 204, in an otherwise identical circuit to that shown in FIG. 2(a). The purpose of capacitor C201 is to further increase the forward RF current through diode D201. The accumulated charge in the capacitor C201 can be easily discharged by the parallel value resistor R204, thus averting the problem of accumulated capacitor charge as occurs in other circuits. Compared with the FIG. 2(a), the predistortion circuit of FIG. 2(b), provides slightly improved (e.g., 1–2 dB) CSO correction, whereas the correction circuit of FIG. 2(a) will give a slightly improved composite triple beat (CTB) correction.

To further improve the CTB performance a second predistortion circuit may be advantageously added in series to the aforementioned predistortion circuit. Examples of such circuits that correct for third order distortion are shown, for example, in U.S. Pat. No. 6,107,877 and copending U.S. application Ser. No. 09/958,010, which are both hereby incorporated by reference in their entirety.

As previously mentioned, the inventors have found that in some cases, by appropriately correcting for distortion in the aforementioned manner, a relatively inexpensive laser diode specified for low power uses can be used as a higher power laser that meets more stringent specifications. However, in order to do so, certain modifications must be made to the package in which the lower power laser diode is housed in order to provide it with the cooling and temperature control that is necessary for it to operate at a higher power level in accordance with more stringent specifications for distortion.

Figure 3:
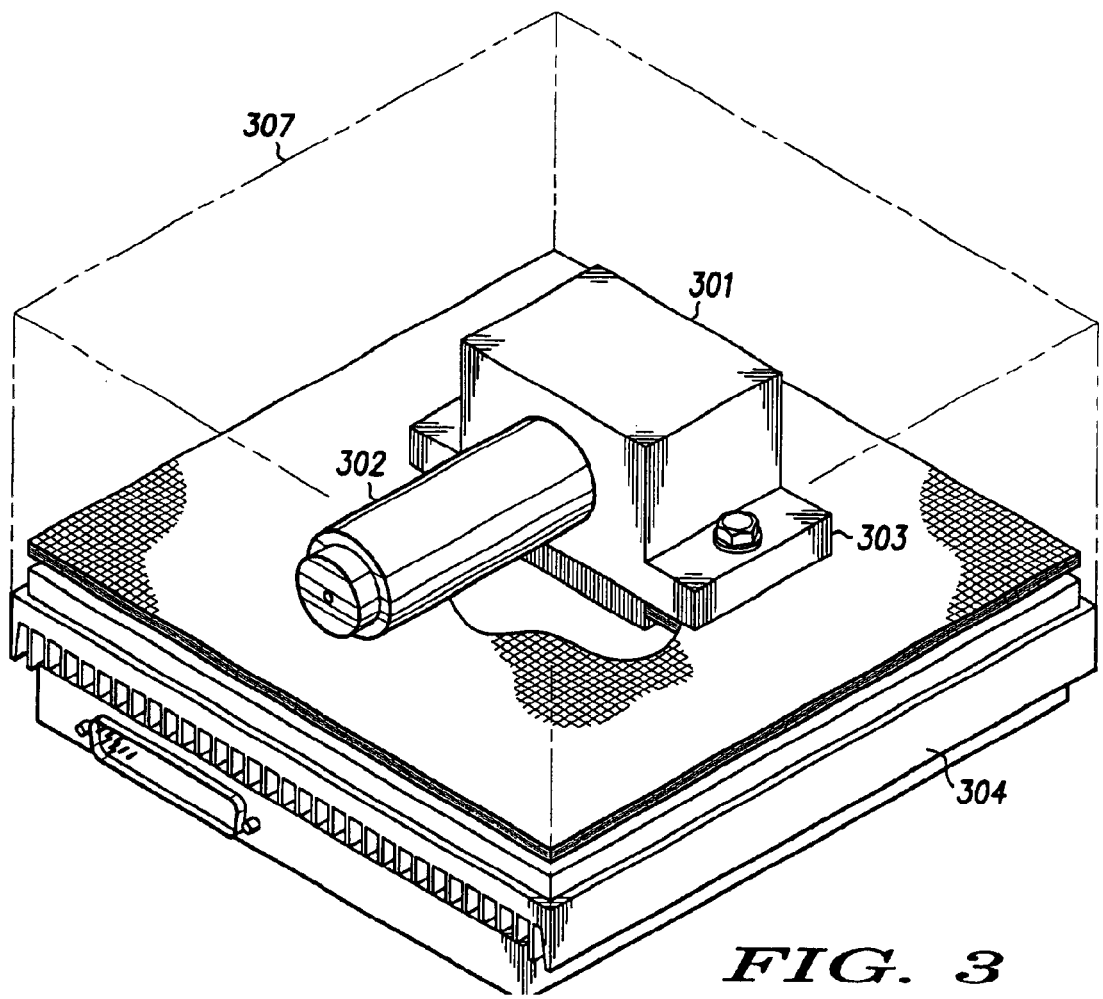
FIG. 3 shows one embodiment of a coaxial can laser having external cooling constructed in accordance with the present invention.

The present invention provides external cooling to a coaxial can laser package whose bias level has been readjusted in the aforementioned manner. While such cooling can be accomplished in a variety of different ways, FIG. 3 shows one embodiment of the invention in which external cooling is accomplished by thermally coupling the coaxial can laser to an external thermo-electric cooler such as a peltier module while isolating the coaxial can laser from ambient air conditions. As shown, laser module 306 includes a coaxial can laser 302 that is mechanically secured to a thermo-electric cooler 303 by a clamp 301 that may be formed from aluminum or other thermally conductive material. The clamp 301 also secures the can laser 302 to a finned heat sink 304. The heat sink 304 includes a retaining wall 307 and a cover (not shown) to seal the laser module 306. The interior of the heat sink 304 may be filled with an expanding polyurethane foam 305 to provide thermal insulation from ambient surroundings. Alternatively, instead of a foam, a premolded insulating cup or covering may be placed over the can laser 302 package and the clamp 301. The covering may be formed, for example, from a urethane material. The thermo-electric cooler 303 removes heat generated by the laser as well as parasitic heat conducted into the clamp 301 from the ambient environment. In the case of a cold ambient environment the electrical polarity of the thermo-electric cooler 303 may be reversed to add instead of remove heat.

Figure 5:
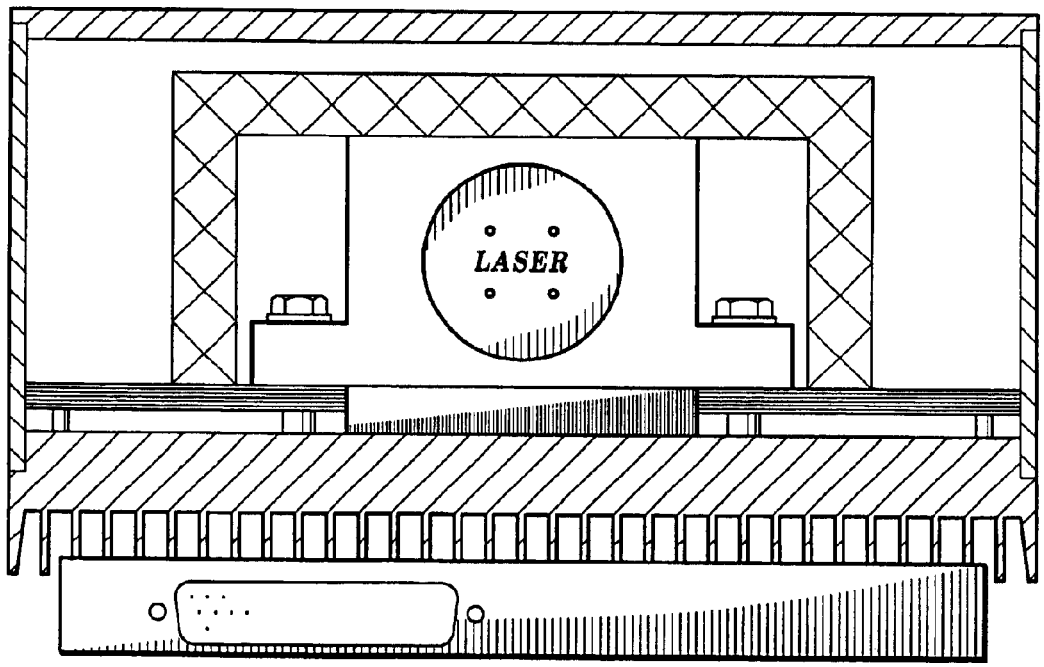
FIG. 5 shows one embodiment of the clamp seen in FIG. 3, which secures the laser diode to the housing.

One embodiment of the clamp 301 is shown in FIG. 5. The clamp 301 serves two important functions. First, the clamp 301 provides a good RF and electrical ground for the laser diode, which is necessary to ensure consistent RF performance. If the RF grounding is not adequate, amplitude irregularities and poor performance will result. The grounding is achieved by using screws to connect the clamp to the heat sink and circuit board on which the electronics are located. In addition, the clamp 301 provides good thermal conductivity to the thermo-electric cooler. The clamp is machined to fit snugly around the laser diode body and flush to the thermo-electric cooler. The addition of a small amount of thermal compound between the laser diode and clamp as well as between the clamp and the thermo-electric cooler ensures maximum thermal conductivity. The compound provides extra thermal isolation from the surroundings, thus reducing the power requirements of the thermo-electric cooler.

In order to properly control the temperature of the laser module 306 it is necessary to monitor the temperature of the laser diode itself, and not simply the temperature at a point immediately external to the coaxial can laser 302. Unfortunately, since a coaxial can laser does not have any provision for internal cooling; it also does not provide a thermistor or other temperature-sensing device. However, such can lasers do typically include a photodiode in addition to the laser cavity itself The photodiode collects light emitted by the back-facet of the laser cavity. The light received by the photodiode is generally proportional to the actual optical output power of the laser emitted through the front facet of the laser cavity. The photodiode thus provides a means for measuring the laser output power.

Figure 4:
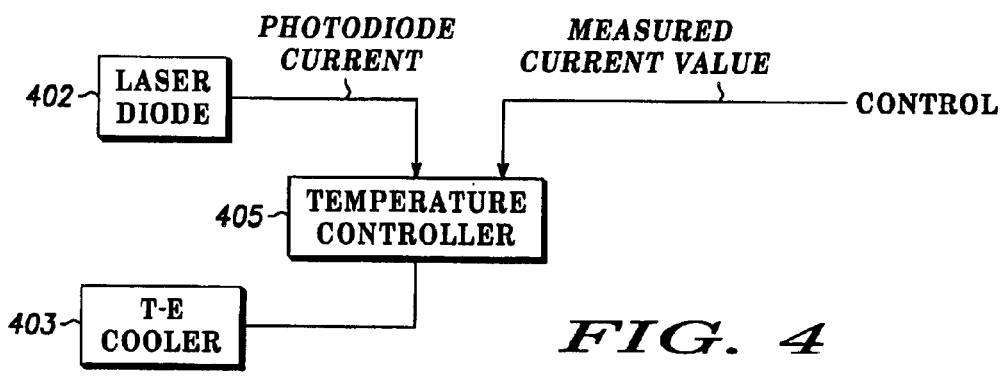
FIG. 4 is a simplified block diagram of a feedback arrangement that may be used to control the external cooler depicted in FIG. 3.

In the present invention the bias level to the laser is held constant. As a result, the output power of the laser (and hence the amount of light received by the photodiode) is (proportional) to its temperature. In other words, the temperature of the laser diode can be determined by measuring the current from the photodiode that collects light from the back-facet of the diode. The laser diode temperature can therefore be held constant by proper adjustment of the external cooling arrangement so that a constant current from the photodiode is maintained. For this purpose the laser module 306 may include a feedback controller such as illustrated by the simplified block diagram of FIG. 4. As shown, the feedback controller 405 receives the current from the back-facet photodiode incorporated with laser diode 402 and determines the laser diode 402 temperature based on the measured value of the current. The output from the feedback controller 405 is applied to the thermo-electric cooler 403 and serves to vary the degree of heating or cooling it supplies to the coaxial can laser so that the current from the photodiode (and hence the temperature of the laser diode 402) is maintained at its desired level, thereby maintaining the bias level that is applied to the laser diode 402 at its optimized level or sweet spot. Feedback controller 405 may employ any feedback approach known to those of ordinary skill in the art, including, for example, a proportional-integral-differential (PID) feedback approach.

Because the bias level of the laser diode is set to its "sweet spot," which can vary from laser to laser, the optical output power of the laser diode will also vary from diode to diode. In general, however, the laser diode must operate at a predefined constant output power, which does not necessarily correspond to its sweet spot bias point. Accordingly, it will typically be desirable to provide another mechanism by which the output power of the laser diode can be adjusted instead of adjusting the bias level. Since in the present invention laser diodes will generally be selected that have a sweet spot bias level that corresponds to an optical output power that is greater than the predefined output power that is required, a mechanism for attenuating the optical output power may be employed. Accordingly, in some embodiments of the invention the laser module may incorporate an adjustable optical attenuator that receives the output power from the laser diode. The attenuator permits the output power from the laser diode to be adjusted downward to a particular power level that is appropriate for a given application.

One example of an optical attenuator that may be employed in the present invention is an optical fiber attenuator in which the bend radius of the optical fiber receiving the output power from the laser diode is varied to thereby induce a controllable and consistent light loss or attenuation in the fiber optic cable. Optical fiber attenuators generally operate by wrapping the fiber optic around a diameter and changing the radius of curvature of the wrapped fiber optic. One example of an optical fiber attenuator that may be employed in the present invention is disclosed in U.S. application Ser. No. 08/153,224, which is hereby incorporated by reference in its entirety. The optical fiber attenuator shown in this reference provides an adjustable spring clip in a housing. The fiber optic is wrapped around the spring clip in one or more loops. Adjusting the position of the spring clip modifies the radius of curvature of the loops and hence modifies the attenuation of the fiber optic. Of course, those of ordinary skill in the art will recognize that the invention is not limited to this particular optical fiber attenuator. Rather, more generally, a variety of different optical attenuators may be alternatively employed in the present invention.

Although various embodiments are specifically illustrated and described herein, it will be appreciated that modifications and variations of the present invention are covered by the above teachings and are within the purview of the appended claims without departing from the spirit and intended scope of the invention. For example, while the present invention has been described in terms of a coaxial can laser, the invention is more generally applicable to any uncooled laser packages such as those fabricated from any metal or ceramic material.

What is claimed is:

1. A method for using an uncooled laser package having pre-established performance specifications that include a pre-established optical power level at a second set of performance specifications that include a second optical power level greater than the pre-established optical power level, said method comprising the steps of:

applying a bias level to a laser diode in the uncooled laser package that optimizes distortion and causes the laser package to generate the second optical power level, said bias level being greater than a pre-established bias level specified to generate the pre-established optical power level; and externally heating or cooling the uncooled laser package to maintain a substantially constant laser diode temperature, wherein the externally heating or cooling step heats or cools the uncooled laser package based on monitoring of a photocurrent generated by a photodiode that collects light from a back-facet of the laser diode, and further wherein the step of externally heating or cooling is performed without relying upon a temperature sensing device to determine a current laser diode temperature.

2. The method of claim 1 wherein the externally heating or cooling step includes the step of maintaining the photocurrent generated by the photodiode at a substantially constant value.

3. The method of claim 2 wherein the step of maintaining the photocurrent generated by the photodiode at a substantially constant value includes the step of adjusting a degree of heating or cooling supplied to the laser package in response to a measured value of the photocurrent.

4. The method of claim 1 wherein said uncooled laser package is a coaxial can laser package.

5. The method of claim 1 wherein the external healing or cooling step is accomplished with a peltier module.

6. The method of claim 1 wherein remaining distortion is reduced by a predistortion circuit.

7. The method of claim 6 wherein said predistortion circuit is an in-line predistortion circuit.

8. The method of claim 1 further comprising the step of attenuating the second optical power level generated by the laser diode.

9. The method of claim 8 wherein the attenuating step is performed by adjusting a bend radius of an optical fiber optically coupled to an output from the laser diode.

10. A thermally-regulated laser module, comprising:

an uncooled, hermetically sealed laser package in which a laser diode is located;

a thermo-electric cooler thermally coupled to the laser package;

a temperature monitor for determining the temperature of the laser diode, wherein said temperature monitor includes a photodiode that monitors a photocurrent by collecting light from a back-facet of the laser diode to determine a laser output power from which said temperature monitor determines the laser diode temperature;

a predistortion circuit coupling an externally received electrical signal to be optically modulated to a signal input of the laser diode; and a feedback controller for maintaining the photocurrent generated by the photodiode at a substantially constant value, wherein the feedback controller is electrically coupled to the thermo-electric cooler for adjusting a degree of heating or cooling supplied to the laser package by the thermo-electric cooler in response to a measured value of the photocurrent, wherein said temperature monitor and said feedback controller do not rely upon a temperature sensing device to determine the laser diode temperature.

11. The laser module of claim 10 wherein said laser package is a coaxial can laser.

12. The laser module of claim 10 wherein said thermoelectric cooler is a peltier cooler.

13. The laser module of claim 10 further comprising a heat sink in which said coaxial can laser is housed.

14. The laser module of claim 13 further comprising a thermally conducting clamp mechanically securing said coaxial can laser package to the thermo-electric cooler.

15. The laser module of claim 14 further comprising an insulating foam substantially filling the heat sink.

16. The laser module of claim 15 wherein said insulating foam is an expanding polyurethane foam.

17. The laser module of claim 14 further comprising a premolded insulating covering located over the laser package and the thermally conducting clamp.

18. The laser module of claim 10 wherein said predistortion circuit is an in-line predistortion circuit.

19. The laser module of claim 10 further comprising an optical attenuator for selectively attenuating optical energy generated by the laser diode.

20. The laser module of claim 19 wherein the optical attenuator adjusts a bend radius of an optical fiber receiving the optical energy from the laser diode.

* * * * *